(12) United States Patent
Huang

(10) Patent No.: US 7,609,143 B2
(45) Date of Patent: Oct. 27, 2009

(54) MULTI-LAYER TYPE OVER-CURRENT AND OVER-TEMPERATURE PROTECTION STRUCTURE AND METHOD FOR MANUFACTURING THE SAME

(75) Inventor: Chien-Hao Huang, Taipei (TW)

(73) Assignee: Inpaq Technology Co., Ltd., Hsinchu (TW)

( * ) Notice: Subject to any disclaimer, the term of this patent is extended or adjusted under 35 U.S.C. 154(b) by 111 days.

(21) Appl. No.: 12/007,491

(22) Filed: Jan. 11, 2008

(65) Prior Publication Data

US 2009/0180230 A1 Jul. 16, 2009

(51) Int. Cl.
*H01C 7/10* (2006.01)
(52) U.S. Cl. .................. 338/22 R; 338/332; 29/621; 29/619
(58) Field of Classification Search ........... 338/22 R, 338/307, 309, 327, 332, 312; 29/612, 621, 29/619
See application file for complete search history.

(56) References Cited

U.S. PATENT DOCUMENTS 5,425,099 A * 6/1995 Takakura et al. ........... 379/413
6,172,591 B1 * 1/2001 Barrett ..................... 338/22 R
6,297,722 B1 * 10/2001 Yeh .......................... 338/22 R
6,388,555 B2 * 5/2002 McLoughlin ............... 338/21
6,686,827 B2 * 2/2004 Chen et al. ................ 338/22 R
7,138,900 B2 * 11/2006 Liu et al. ................... 338/22 R

* cited by examiner

*Primary Examiner*—Kyung Lee
(74) *Attorney, Agent, or Firm*—Rosenberg, Klein & Lee

(57) ABSTRACT

A multi-layer type over-current and over-temperature protection structure and a method of manufacturing the same are disclosed. The present invention utilizes the concept of multi-layer design to integrate more than two over-current and over-temperature protection elements on a component structure that can be adhered to a substrate. Hence, the over-current and over-temperature protection structure has more than two over-current and over-temperature protection functions at the same time. Therefore, the advantages of the present invention is that the over-current and over-temperature protection structure effectively integrates two or more over-current and over-temperature protection elements together in order to increase the usage range of the over-current and over-temperature protection structure. Moreover, the present invention effectively reduces size of the over-current and over-temperature protection elements on a PCB and reduces the number of solder joints.

34 Claims, 10 Drawing Sheets

MULTI-LAYER TYPE OVER-CURRENT AND OVER-TEMPERATURE PROTECTION STRUCTURE AND METHOD FOR MANUFACTURING THE SAME

BACKGROUND OF THE INVENTION

1. Field of the Invention

The present invention relates to an over-current and over-temperature protection structure and a method for manufacturing the same, and particularly relates to a multi-layer type over-current and over-temperature protection structure and a method for manufacturing the same.

2. Description of the Related Art

Future electronic products have the requirement of being light, thin, short, and small. Moreover, the size of passive electronic components in those products is becoming larger than that of the other components. Hence, if the passive components can be effectively integrated, the electronic product can achieve the quality of being light, thin, short and small.

However, each passive component only has a single function in the prior design. Hence, when a designer needs to use many different functions for protecting the electronic product, the designer only can place many passive components with a single function in the electronic product. Therefore, the method of the prior art wastes cost and occupies much space in the electronic product

SUMMARY OF THE INVENTION

One particular aspect of the present invention is to provide a multi-layer type over-current and over-temperature protection structure and a method for manufacturing the same. The present invention utilizes the concept of multi-layer design to integrated more than two passive components on a component structure that is adhered onto a substrate. Hence, the multi-layer type over-current and over-temperature protection structure has more than two over-current and over-temperature protection functions at the same time.

In order to achieve the above-mentioned aspects, the present invention provides a multi-layer type over-current and over-temperature protection structure that includes: at least two over-current and over-temperature protection elements, an insulative element, and a lateral conductive unit.

Each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer.

The insulative element is disposed between the two over-current and over-temperature protection elements for insulating the two over-current and over-temperature protection elements from each other. The lateral conductive unit has a plurality of lateral conductive layers insulated from each other. Each lateral conductive layer is formed from top to bottom on lateral sides of one of the two over-current and over-temperature protection elements, the insulative element, and the other over-current and over-temperature protection element in sequence, and each lateral conductive layer is electrically connected with one of the power input portions or one of the power output portions.

In order to achieve the above-mentioned aspects, the present invention provides a multi-layer type over-current and over-temperature protection structure that includes: a plurality of over-current and over-temperature protection elements, a plurality of insulative elements, and a lateral conductive unit.

Each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer.

The insulative elements are respectively disposed between each two over-current and over-temperature protection elements for insulating the over-current and over-temperature protection elements from each other. The lateral conductive unit has a plurality of lateral conductive layers insulated from each other. Each lateral conductive layer is formed from top to bottom on lateral sides of the two over-current and over-temperature protection elements and the insulative elements, and each lateral conductive layer is electrically connected with one of the power input portions or one of the power output portions.

In order to achieve the above-mentioned aspects, the present invention provides a method for manufacturing a multi-layer type over-current and over-temperature protection structure, includes: providing a top cover insulating layer that has a plurality of top cover conductive pads formed on a top surface thereof and insulated from each other; and providing at least two over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer;

The method further includes: providing an insulative element disposed between the two over-current and over-temperature protection elements for insulating the two over-current and over-temperature protection elements from each other; providing a bottom cover insulating layer that has a plurality of bottom cover conductive pads formed on a bottom surface thereof and insulated from each other; making the top cover insulating layer, a combination of the two over-current and over-temperature protection elements and the insulative element, and the bottom cover insulating layer stacked together in sequence; and forming a plurality of lateral conductive layers insulated from each other, wherein each lateral conductive layer is formed on lateral sides of the top cover insulating layer, the combination of the two over-current and over-temperature protection elements and the insulative element, and the bottom cover insulating layer in sequence, and each lateral conductive layer is electrically connected with the corresponding top conductive pad, the corresponding bottom conductive pad, and one of the power input portions or one of the power output portions.

In order to achieve the above-mentioned aspects, the present invention provides a method for manufacturing a multi-layer type over-current and over-temperature protection structure, includes: providing a top cover insulating layer that has a plurality of top cover conductive pads formed on a top surface thereof and insulated from each other; and providing a plurality of over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer.

The method further includes: providing a plurality of insulative elements respectively disposed between each two over-current and over-temperature protection elements for insulating the over-current and over-temperature protection elements from each other; providing a bottom cover insulating layer that has a plurality of bottom cover conductive pads formed on a bottom surface thereof and insulated from each other; making the top cover insulating layer, a combination of the over-current and over-temperature protection elements and the insulative elements, and the bottom cover insulating layer stacked together in sequence; and forming a plurality of lateral conductive layers insulated from each other, wherein each lateral conductive layer is formed on lateral sides of the top cover insulating layer, the combination of the over-current and over-temperature protection elements and the insulative elements, and the bottom cover insulating layer in sequence, and each lateral conductive layer is electrically connected with the corresponding top conductive pad, the corresponding bottom conductive pad, and one of the power input portions or one of the power output portions.

Therefore, the advantage of the present invention is that the multi-layer type over-current and over-temperature protection structure has more than two over-current and over-temperature protection functions at the same time. Hence, the present invention effectively integrates two or more passive components in order to increase the usage range of the over-current and over-temperature protection structure. Moreover, the present invention effectively reduces the size of the passive components on a PCB and reduces the number of solder joints.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1A:
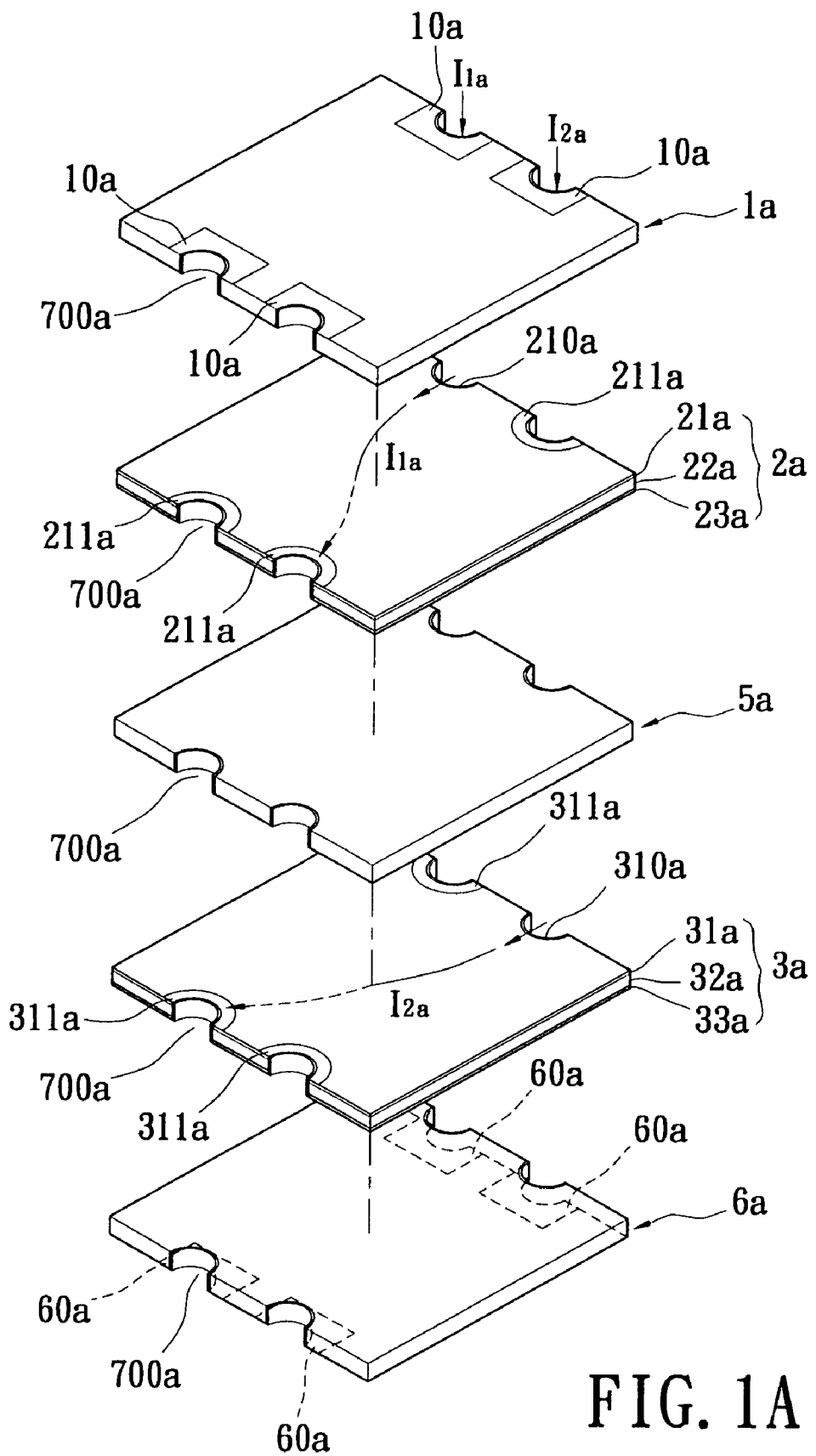
FIG. 1A is a perspective, exploded view of a multi-layer type over-current and over-temperature protection structure according to the first embodiment of the present.
Figure 1B:
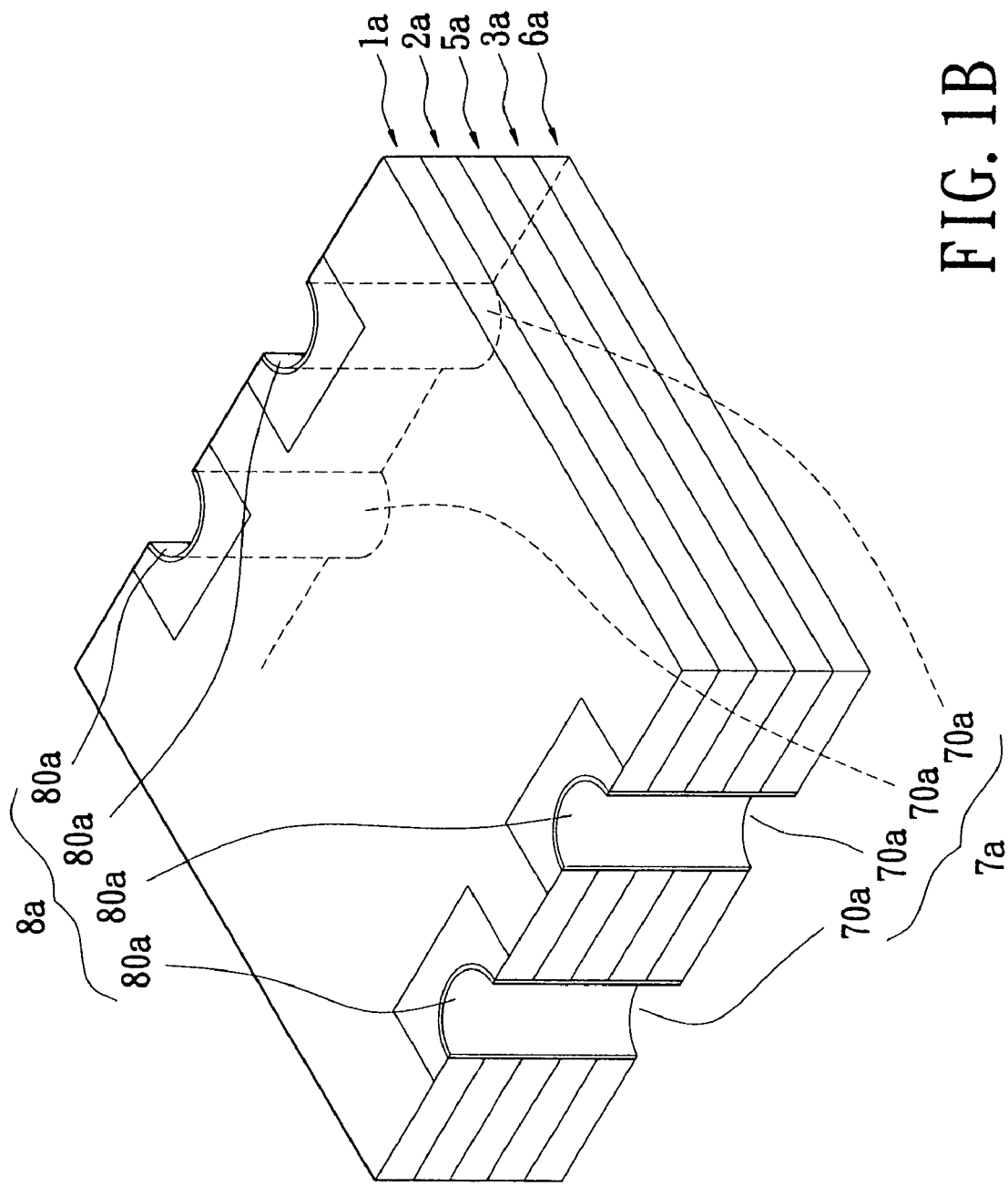
FIG. 1B is a perspective, assembled view of a multi-layer type over-current and over-temperature protection structure according to the first embodiment of the present.
Figure 1C:
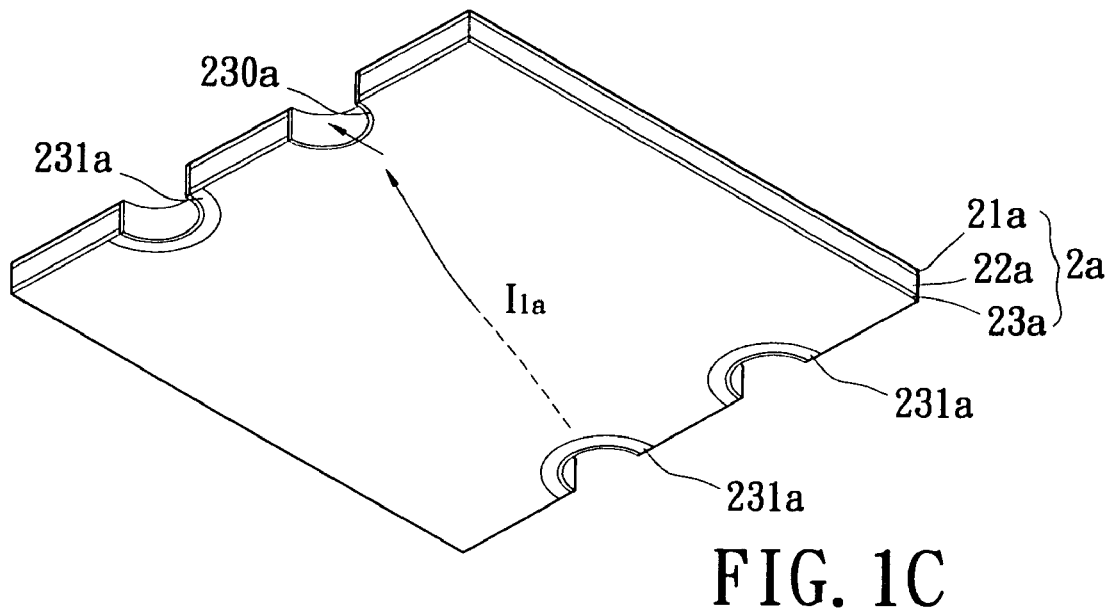
FIG. 1C is a reversed, perspective view of a first over-current and over-temperature protection element according to the first embodiment of the present.
Figure 1D:
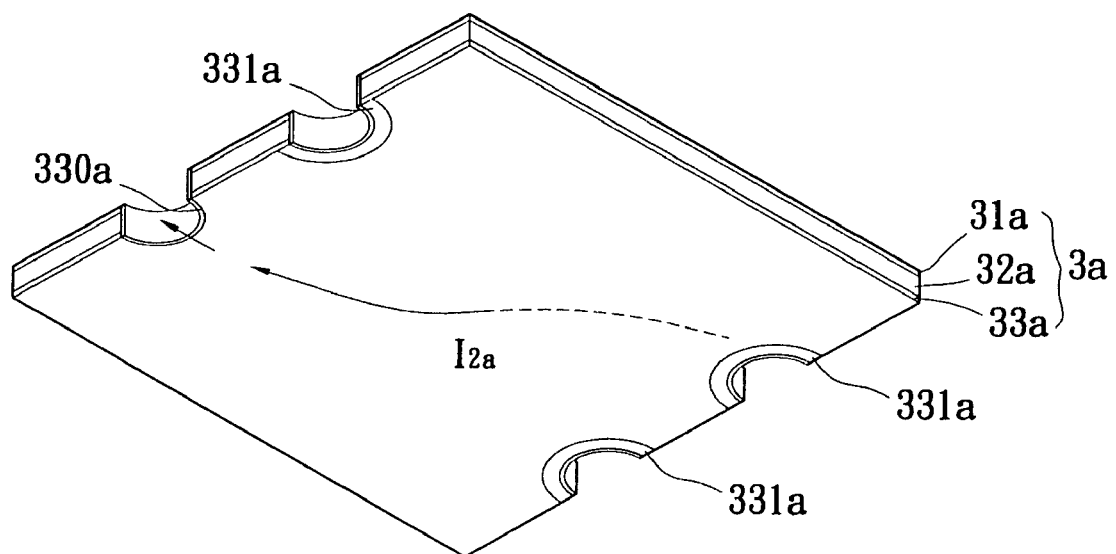
FIG. 1D is a reversed, perspective view of a second over-current and over-temperature protection element according to the first embodiment of the present.

Referring to FIGS. 1A to 1D, FIG. 1A shows a perspective, exploded view of a multi-layer type over-current and over-temperature protection structure according to the first embodiment of the present, FIG. 1B shows a perspective, assembled view of a multi-layer type over-current and over-temperature protection structure according to the first embodiment of the present, FIG. 1C shows a reversed, perspective view of a first over-current and over-temperature protection element according to the first embodiment of the present, and FIG. 1D shows a reversed, perspective view of a second over-current and over-temperature protection element according to the first embodiment of the present.

Referring to FIGS. 1A and 1B, the first embodiment of the present invention provides a multi-layer type over-current and over-temperature protection structure that includes a top cover insulating layer 1a, a first over-current and over-temperature protection element 2a, a second over-current and over-temperature protection element 3a, an insulative element 5a, a bottom cover insulating layer 6a, a lateral through groove unit 7a with four lateral through grooves 70a insulated from each other, and a lateral conductive unit 8a with four lateral conductive layers 80a.

The top cover insulating layer 1a is disposed on the first over-current and over-temperature protection element 2a.

The top cover insulating layer 1a has a plurality of top cover conductive pads 10a formed on a top surface thereof and respectively electrically connected with the four lateral conductive layers 80a. In addition, the top cover insulating layer 1a can be made of polypropylene or fiberglass material, and the top cover conductive pads 10a can be tinsels such as coppers or nickel etc.

Moreover, the first over-current and over-temperature protection element 2a includes a first top electrode layer 21a, a first bottom electrode layer 23a, a first positive temperature coefficient material layer 22a disposed between the first top electrode layer 21a and the first bottom electrode layer 23a. The first top electrode layers 21a and the first bottom electrode layers 23a can be tinsels such as coppers or nickel etc. The first positive temperature coefficient material layer 22a can be a PPTC (Polymer Positive Temperature Coefficient) material layer, a resistance material layer, a capacitance material layer, or an inductance material layer etc.

Furthermore, the first over-current and over-temperature protection element 2a includes a first power input portion, a first power output portion, and a plurality of first insulative portions. For example, in the first embodiment, the first top electrode layer 21a has a first power input portion 210a formed on a top surface thereof and electrically connected with one lateral conductive layer 80a and a plurality of first insulative portions 211a. Referring to FIG. 1C, the first bottom electrode layer 23a has a first power output portion 230a formed on a bottom surface thereof and electrically connected with one lateral conductive layer 80a and a plurality of first insulative portions 231a.

Hence, the first insulative portions (211a, 231a) are respectively formed on the top surface of the first top electrode layer 21a and the bottom surface of the first bottom electrode layer 23a in order to insulate the first top electrode layer 21a and the first bottom electrode layer 23a from the lateral conductive layer 80a via the first insulative portions (211a, 231a). Therefore, the first insulative portions (211a, 231a) are used to limit currents $I_{1a}$ (as shown in FIG. 1A) in the first over-current and over-temperature protection element 2a to only flow from the first power input portion 210a to the first power output portion 230a through the first positive temperature coefficient material layer 22a.

Moreover, the second over-current and over-temperature protection element 3a includes a second top electrode layer 31a, a second bottom electrode layer 33a, a second positive temperature coefficient material layer 32a disposed between the second top electrode layer 31a and the second bottom electrode layer 33a. The second top electrode layers 31a and the second bottom electrode layers 33a can be tinsels such as coppers or nickel etc. The second positive temperature coefficient material layer 32a can be a PPTC (Polymer Positive Temperature Coefficient) material layer, a resistance material layer, a capacitance material layer, or an inductance material layer etc.

Furthermore, the second over-current and over-temperature protection element 3a includes a second power input portion, a second power output portion, and a plurality of second insulative portions. For example, in the first embodiment, the second top electrode layer 31a has a second power input portion 310a formed on a top surface thereof and electrically connected with one lateral conductive layer 80a and a plurality of second insulative portions 311a. Referring to FIG. 1D, the second bottom electrode layer 33a has a second power output portion 330a formed on a bottom surface thereof and electrically connected with one lateral conductive layer 80a and a plurality of second insulative portions 331a.

Hence, the second insulative portions (311a, 331a) are respectively formed on the top surface of the second top electrode layer 31a and the bottom surface of the second bottom electrode layer 33a in order to insulate the second top electrode layer 31a and the second bottom electrode layer 33a from the lateral conductive layer 80a via the second insulative portions (311a, 331a). Therefore, the second insulative portions (311a, 331a) are used to limit currents $I_{2a}$ (as shown in FIG. 1A) in the second over-current and over-temperature protection element 3a to only flow from the second power input portion 310a to the second power output portion 330a through the second positive temperature coefficient material layer 32a.

In addition, the insulative element 5a is disposed between the first over-current and over-temperature protection element 2a and the second over-current and over-temperature protection element 3a for insulating the two over-current and over-temperature protection elements (2a, 3a) from each other.

Moreover, the bottom cover insulating layer 6a is disposed under the second over-current and over-temperature protection element 3a. The bottom cover insulating layer 6a has four bottom cover conductive pads 60a formed on a bottom surface thereof and respectively electrically connected with the four lateral conductive layers 80a. In addition, the bottom cover insulating layer 6a can be made of polypropylene or fiberglass material, and the bottom cover conductive pads 60a can be tinsels such as coppers or nickel etc.

Furthermore, each lateral through groove 70a is composed of five half holes 700a that are stacked to each other, and the half holes 700a are respectively formed on the same sides of the top cover insulating layer 1a, the first over-current and over-temperature protection element 2a, the insulative element 5a, the second over-current and over-temperature protection element 3a, and the bottom cover insulating layer 6a in sequence. In other words, each lateral through groove 70a is formed from top to bottom on lateral sides of the top cover insulating layer 1a, the first over-current and over-temperature protection element 2a, the insulative element 5a, the second over-current and over-temperature protection element 3a, and the bottom cover insulating layer 6a in sequence.

In addition, the lateral conductive layers 80a are respectively formed on inner surfaces of the lateral through grooves 70a. Each lateral conductive layer 80a is electrically connected with one of the first power input portion 210a, the first power output portion 230a, the second power input portion 310a, or the second power output portion 330a. Moreover, the lateral through grooves 70a can be omitted in the present invention, so the lateral conductive layers 80a from top to bottom can be formed on lateral sides of the top cover insulating layer 1a, the first over-current and over-temperature protection element 2a, the insulative element 5a, the second over-current and over-temperature protection element 3a, and the bottom cover insulating layer 6a in sequence.

Referring to FIGS. 1A and 1C, the arrows mean the directions of currents in the above-mentioned figures. The main path of the current $I_{1a}$ in the first over-current and over-temperature protection element 2a is shown as follows:

1. Firstly, the current $I_{1a}$ flows from one of the top cover conductive pads 10a of the top cover insulating layer 1a to the first top electrode layer 21a of the first over-current and over-temperature protection element 2a via one of the lateral conductive layers 80a;
2. The current $I_{1a}$ passes through the first positive temperature coefficient material layer 22a from the first power input portion 210a of the first top electrode layer 21a and flows to the first bottom electrode layer 23a; and 3. Finally, the current $I_{1a}$ flows from the first power output portion 230a of the first bottom electrode layer 23a to another lateral conductive layer 80a in order to obtain a first OCP (Over-Current Protection) function due to the material property of the first positive temperature coefficient material layer 22a.

Referring to FIGS. 1A and 1D, the arrows mean the directions of currents in the above-mentioned figures. The main path of the current $I_{2a}$ in the second over-current and over-temperature protection element 3a is shown as follows:

1. Firstly, the current $I_{2a}$ flows from one of the top cover conductive pads 10a of the top cover insulating layer 1a to the second top electrode layer 31a of the second over-current and over-temperature protection element 3a via one of the lateral conductive layers 80a;
2. The current $I_{2a}$ passes through the second positive temperature coefficient material layer 32a from the second power input portion 310a of the second top electrode layer 31a and flows to the second bottom electrode layer 33a; and
3. Finally, the current $I_{2a}$ flows from the second power output portion 330a of the second bottom electrode layer 33a to another lateral conductive layer 80a in order to obtain a second OCP (Over-Current Protection) function due to the material property of the first positive temperature coefficient material layer 22a.

However, above-mentioned flow directions of the currents ($I_{1a}$, $I_{2a}$) do not use to limit the present invention. For example, the currents ($I_{1a}$, $I_{2a}$) can get new flow directions that are opposite to above-mentioned flow directions, and the function is the same. Moreover, the multi-layer type over-current and over-temperature protection structure of the present invention can be inverted, so that the bottom cover conductive pads 60a of the bottom cover insulating layer 6a can be as power input sides.

Figure 2A:
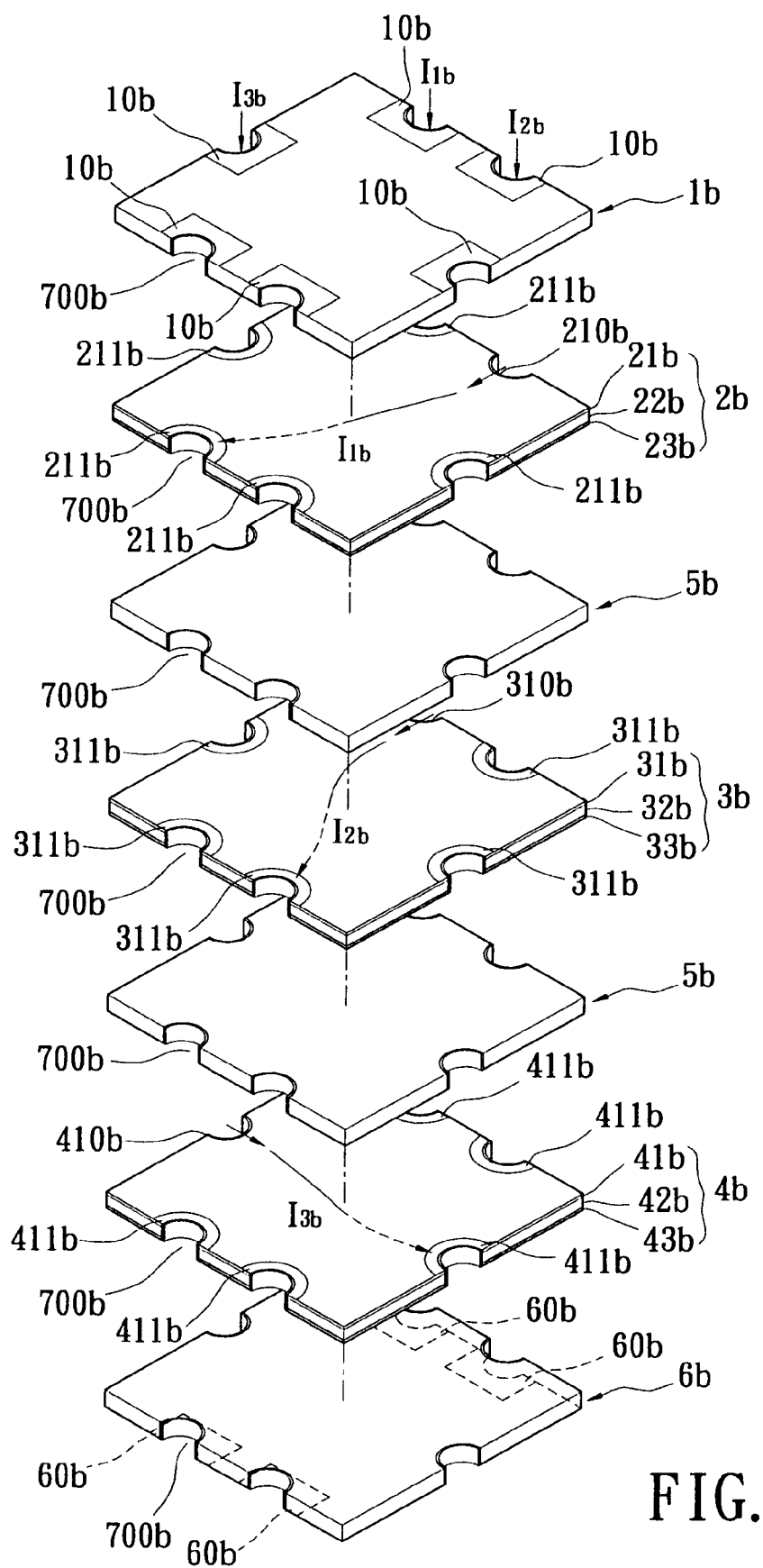
FIG. 2A is a perspective, exploded view of a multi-layer type over-current and over-temperature protection structure according to the second embodiment of the present.
Figure 2B:
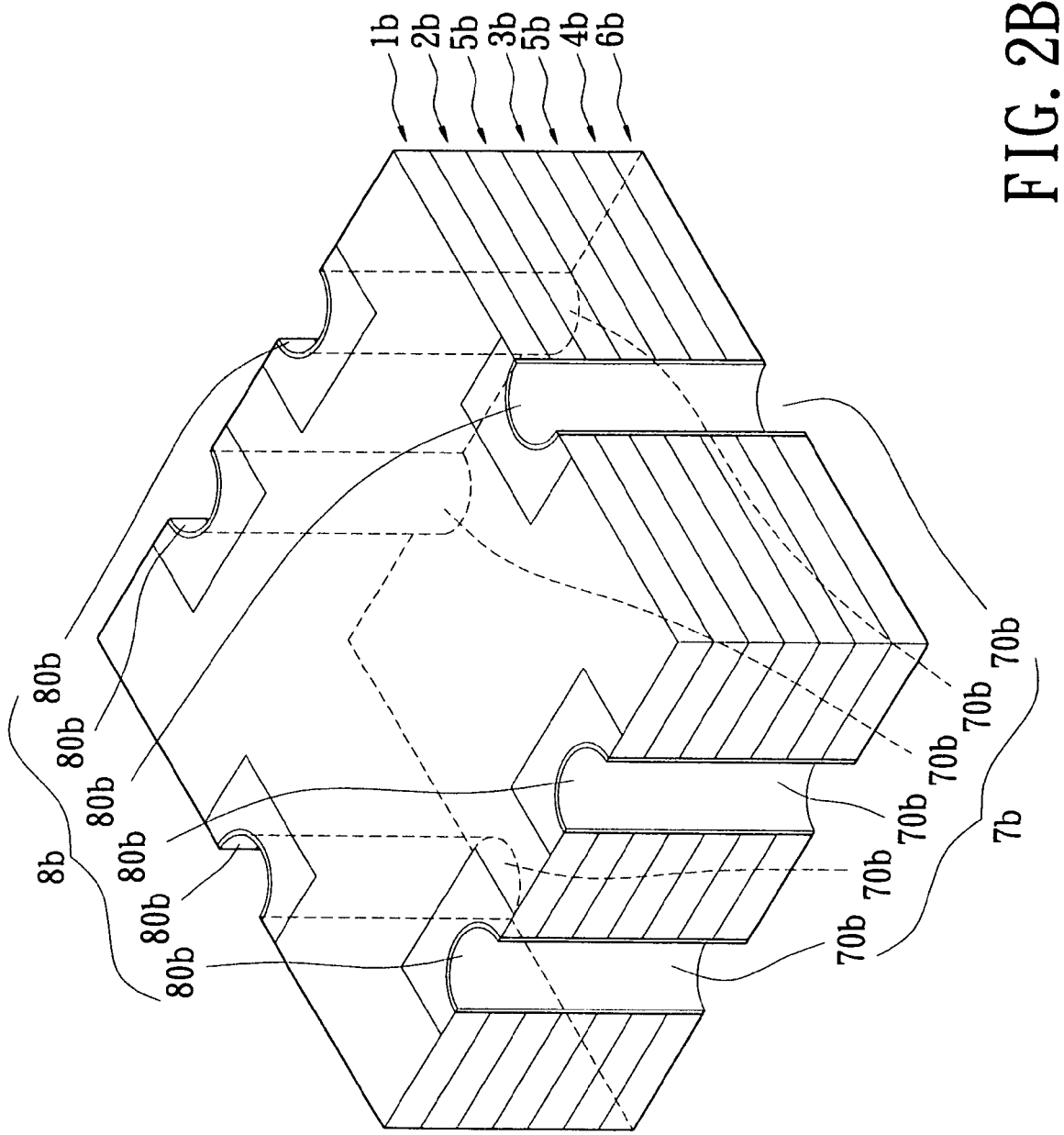
FIG. 2B is a perspective, assembled view of a multi-layer type over-current and over-temperature protection structure according to the second embodiment of the present.
Figure 2C:
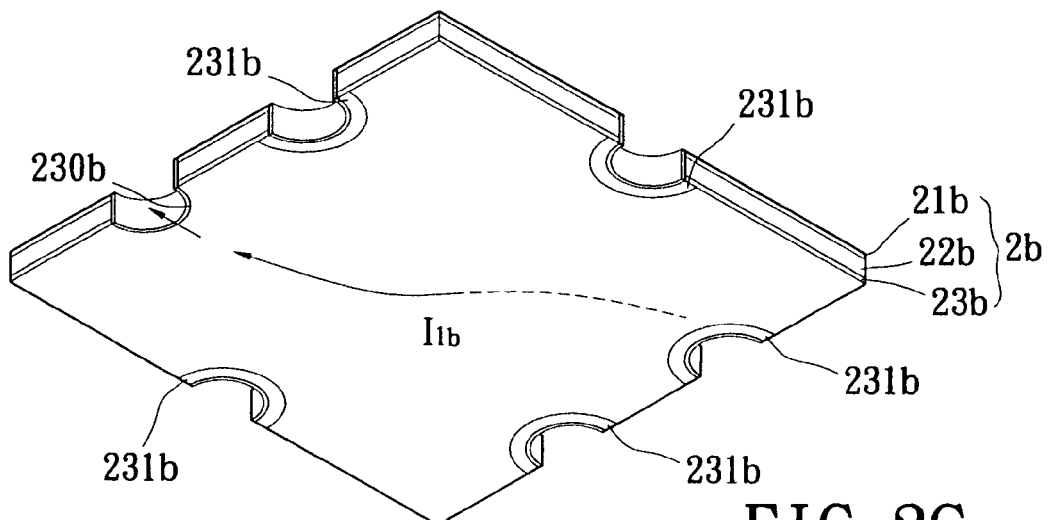
FIG. 2C is a reversed, perspective view of a first over-current and over-temperature protection element according to the second embodiment of the present.
Figure 2D:
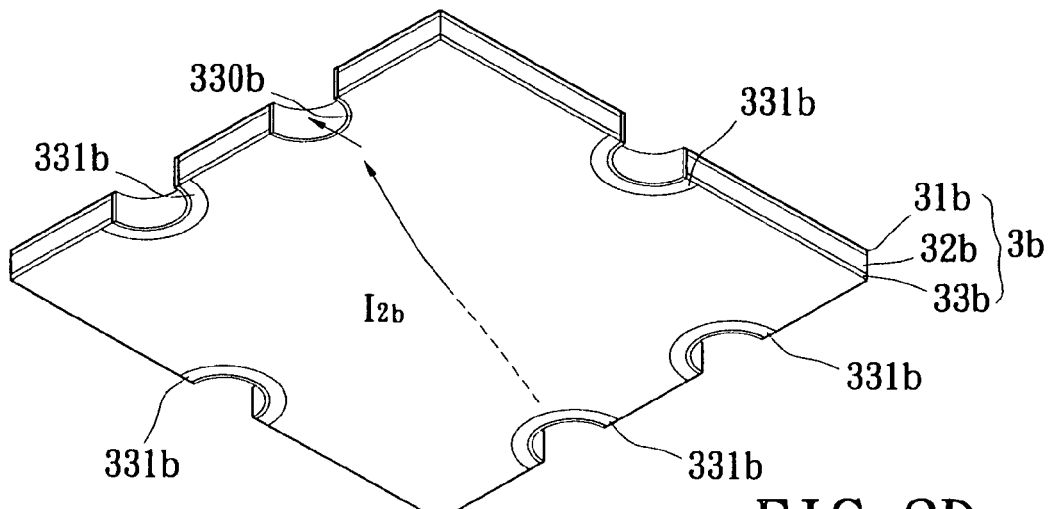
FIG. 2D is a reversed, perspective view of a second over-current and over-temperature protection element according to the second embodiment of the present.
Figure 2E:
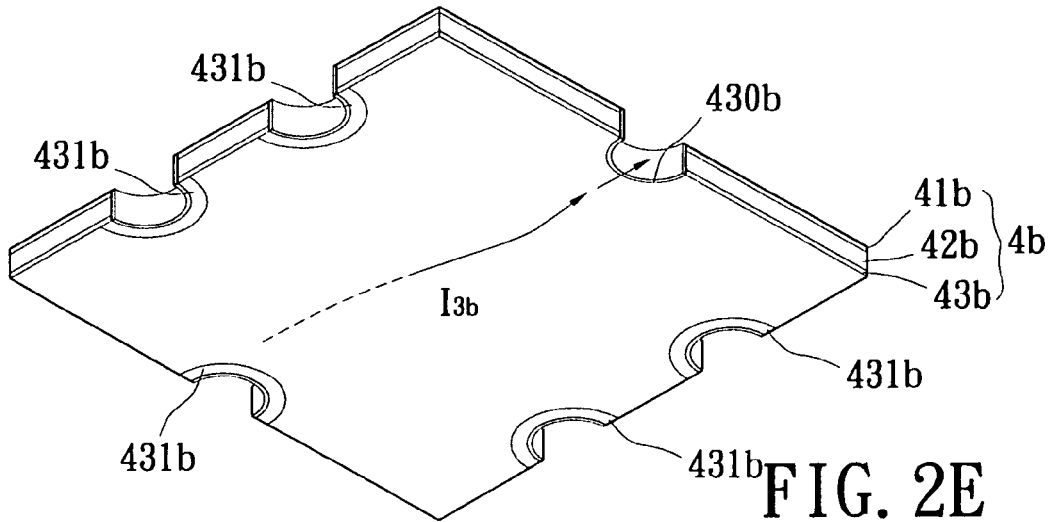
FIG. 2E is a reversed, perspective view of a third over-current and over-temperature protection element according to the second embodiment of the present.

Referring to FIGS. 2A to 2E, FIG. 2A shows a perspective, exploded view of a multi-layer type over-current and over-temperature protection structure according to the second embodiment of the present, FIG. 2B shows a perspective, assembled view of a multi-layer type over-current and over-temperature protection structure according to the second embodiment of the present, FIG. 2C shows a reversed, perspective view of a first over-current and over-temperature protection element according to the second embodiment of the present, FIG. 2D shows a reversed, perspective view of a second over-current and over-temperature protection element according to the second embodiment of the present, and FIG. 2E shows a reversed, perspective view of a third over-current and over-temperature protection element according to the second embodiment of the present.

Referring to FIGS. 2A and 2B, the second embodiment of the present invention provides a multi-layer type over-current and over-temperature protection structure that includes a top cover insulating layer 1b, a first over-current and over-temperature protection element 2b, a second over-current and over-temperature protection element 3b, a third over-current and over-temperature protection element 4b, two insulative elements 5b, a bottom cover insulating layer 6b, a lateral through groove unit 7b with six lateral through grooves 70b insulated from each other, and a lateral conductive unit 8b with six lateral conductive layers 80b.

The top cover insulating layer 1b is disposed on the first over-current and over-temperature protection element 2b. The top cover insulating layer 1b has a plurality of top cover conductive pads 10b formed on a top surface thereof and respectively electrically connected with the six lateral conductive layers 80b. In addition, the top cover insulating layer 1b can be made of polypropylene or fiberglass material, and the top cover conductive pads 10b can be tinsels such as coppers or nickel etc.

Moreover, the first over-current and over-temperature protection element 2b includes a first top electrode layer 21b, a first bottom electrode layer 23b, a first positive temperature coefficient material layer 22b disposed between the first top electrode layer 21b and the first bottom electrode layer 23b. The first top electrode layers 21b and the first bottom electrode layers 23b can be tinsels such as coppers or nickel etc. The first positive temperature coefficient material layer 22b can be a PPTC (Polymer Positive Temperature Coefficient) material layer, a resistance material layer, a capacitance material layer, or an inductance material layer etc.

Furthermore, the first over-current and over-temperature protection element 2b includes a first power input portion, a first power output portion, and a plurality of first insulative portions. For example, in the second embodiment, the first top electrode layer 21b has a first power input portion 210b formed on a top surface thereof and electrically connected with one lateral conductive layer 80b and a plurality of first insulative portions 211b. Referring to FIG. 1C, the first bottom electrode layer 23b has a first power output portion 230b formed on a bottom surface thereof and electrically connected with one lateral conductive layer 80b and a plurality of first insulative portions 231b.

Hence, the first insulative portions (211b, 231b) are respectively formed on the top surface of the first top electrode layer 21b and the bottom surface of the first bottom electrode layer 23b in order to insulate the first top electrode layer 21b and the first bottom electrode layer 23b from the lateral conductive layer 80b via the first insulative portions (211b, 231b). Therefore, the first insulative portions (211b, 231b) are used to limit currents $I_{1b}$ (as shown in FIG. 2A) in the first over-current and over-temperature protection element 2b to only flow from the first power input portion 210b to the first power output portion 230b through the first positive temperature coefficient material layer 22b.

Moreover, the second over-current and over-temperature protection element 3b includes a second top electrode layer 31b, a second bottom electrode layer 33b, a second positive temperature coefficient material layer 32b disposed between the second top electrode layer 31b and the second bottom electrode layer 33b. The second top electrode layers 31b and the second bottom electrode layers 33b can be tinsels such as coppers or nickel etc. The second positive temperature coefficient material layer 32b can be a PPTC (Polymer Positive Temperature Coefficient) material layer, a resistance material layer, a capacitance material layer, or an inductance material layer etc.

Furthermore, the second over-current and over-temperature protection element 3b includes a second power input portion, a second power output portion, and a plurality of second insulative portions. For example, in the second embodiment, the second top electrode layer 31b has a second power input portion 310b formed on a top surface thereof and electrically connected with one lateral conductive layer 80b and a plurality of second insulative portions 311b. Referring to FIG. 2D, the second bottom electrode layer 33b has a second power output portion 330b formed on a bottom surface thereof and electrically connected with one lateral conductive layer 80b and a plurality of second insulative portions 331b.

Hence, the second insulative portions (311b, 331b) are respectively formed on the top surface of the second top electrode layer 31b and the bottom surface of the second bottom electrode layer 33b in order to insulate the second top electrode layer 31b and the second bottom electrode layer 33b from the lateral conductive layer 80b via the second insulative portions (311b, 331b). Therefore, the second insulative portions (311b, 331b) are used to limit currents $I_{2b}$ (as shown in FIG. 2A) in the second over-current and over-temperature protection element 3b to only flow from the second power input portion 310b to the second power output portion 330b through the second positive temperature coefficient material layer 32b.

Moreover, the third over-current and over-temperature protection element 4b includes a third top electrode layer 41b, a third bottom electrode layer 43b, a third positive temperature coefficient material layer 42b disposed between the third top electrode layer 41b and the third bottom electrode layer 43b. The third top electrode layers 41b and the third bottom electrode layers 43b can be tinsels such as coppers or nickel etc. The third positive temperature coefficient material layer 42b can be a PPTC (Polymer Positive Temperature Coefficient) material layer, a resistance material layer, a capacitance material layer, or an inductance material layer etc.

Furthermore, the third over-current and over-temperature protection element 4b includes a third power input portion, a third power output portion, and a plurality of third insulative portions. For example, in the second embodiment, the third top electrode layer 41b has a third power input portion 410b formed on a top surface thereof and electrically connected with one lateral conductive layer 80b and a plurality of third insulative portions 411b. Referring to FIG. 2D, the third bottom electrode layer 43b has a third power output portion 430b formed on a bottom surface thereof and electrically connected with one lateral conductive layer 80b and a plurality of third insulative portions 431b.

Hence, the third insulative portions (411b, 431b) are respectively formed on the top surface of the third top electrode layer 41b and the bottom surface of the third bottom electrode layer 43b in order to insulate the third top electrode layer 41b and the third bottom electrode layer 43b from the lateral conductive layer 80b via the third insulative portions (411b, 431b). Therefore, the third insulative portions (411b, 431b) are used to limit currents $I_{3b}$ (as shown in FIG. 2A) in the third over-current and over-temperature protection element 4b to only flow from the third power input portion 410b to the third power output portion 430b through the third positive temperature coefficient material layer 42b.

In addition, the two insulative elements 5b are respectively disposed between the first over-current and over-temperature protection element 2b and the second over-current and over-temperature protection element 3b and between the second over-current and over-temperature protection element 3b and the third over-current and over-temperature protection element 4b for insulating the two over-current and over-temperature protection elements (2b, 3b) from each other and the two over-current and over-temperature protection elements (3b, 4b) from each other.

Moreover, the bottom cover insulating layer 6b is disposed under the third over-current and over-temperature protection element 4b. The bottom cover insulating layer 6b has six bottom cover conductive pads 60a formed on a bottom surface thereof and respectively electrically connected with the six lateral conductive layers 80b. In addition, the bottom cover insulating layer 6b can be made of polypropylene or fiberglass material, and the bottom cover conductive pads 60b can be tinsels such as coppers or nickel etc.

Furthermore, each lateral through groove 70b is composed of seven half holes 700b that are stacked to each other, and the half holes 700b are respectively formed on the same sides of the top cover insulating layer 1b, the first over-current and over-temperature protection element 2b, the insulative element 5b, the second over-current and over-temperature protection element 3b, the insulative element 5b, the third over-current and over-temperature protection element 4b, and the bottom cover insulating layer 6b in sequence. In other words, each lateral through groove 70b is formed from top to bottom on lateral sides of the top cover insulating layer 1b, the first over-current and over-temperature protection element 2b, the insulative element 5b, the second over-current and over-temperature protection element 3b, the insulative element 5b, the third over-current and over-temperature protection element 4b, and the bottom cover insulating layer 6b in sequence.

In addition, the lateral conductive layers 80b are respectively formed on inner surfaces of the lateral through grooves 70b. Each lateral conductive layer 80b is electrically connected with one of the first power input portion 210b, the first power output portion 230b, the second power input portion 310b, the second power output portion 330b, the third power input portion 410b, or the third power output portion 430b. Moreover, the lateral through grooves 70b can be omitted in the present invention, so the lateral conductive layers 80b from top to bottom can be formed on lateral sides of the top cover insulating layer 1b, the first over-current and over-temperature protection element 2b, the insulative element 5b, the second over-current and over-temperature protection element 3b, the insulative element 5b, the third over-current and over-temperature protection element 4b, and the bottom cover insulating layer 6b in sequence.

Referring to FIGS. 2A and 2C, the arrows mean the directions of currents in the above-mentioned figures. The main path of the current $I_{1b}$ in the first over-current and over-temperature protection element 2b is shown as follows:
1. Firstly, the current $I_{1b}$ flows from one of the top cover conductive pads 10b of the top cover insulating layer 1b to the first top electrode layer 21b of the first over-current and over-temperature protection element 2b via one of the lateral conductive layers 80b;
2. The current $I_{1b}$ passes through the first positive temperature coefficient material layer 22b from the first power input portion 210b of the first top electrode layer 21b and flows to the first bottom electrode layer 23b; and
3. Finally, the current $I_{1b}$ flows from the first power output portion 230b of the first bottom electrode layer 23b to another lateral conductive layer 80b in order to obtain a first OCP (Over-Current Protection) function due to the material property of the first positive temperature coefficient material layer 22b.

Referring to FIGS. 2A and 2D, the arrows mean the directions of currents in the above-mentioned figures. The main path of the current $I_{2b}$ in the second over-current and over-temperature protection element 3b is shown as follows:
1. Firstly, the current $I_{2b}$ flows from one of the top cover conductive pads 10b of the top cover insulating layer 1b to the second top electrode layer 31b of the second over-current and over-temperature protection element 3b via one of the lateral conductive layers 80b;
2. The current $I_{2b}$ passes through the second positive temperature coefficient material layer 32b from the second power input portion 310b of the second top electrode layer 31b and flows to the second bottom electrode layer 33b; and
3. Finally, the current $I_{2b}$ flows from the second power output portion 330b of the second bottom electrode layer 33b to another lateral conductive layer 80b in order to obtain a second OCP (Over-Current Protection) function due to the material property of the second positive temperature coefficient material layer 32b.

Referring to FIGS. 2A and 2E, the arrows mean the directions of currents in the above-mentioned figures. The main path of the current $I_{3b}$ in the third over-current and over-temperature protection element 4b is shown as follows:

1. Firstly, the current $I_{3b}$ flows from one of the top cover conductive pads 10b of the top cover insulating layer 1b to the third top electrode layer 41b of the third over-current and over-temperature protection element 4b via one of the lateral conductive layers 80b;
2. The current $I_{3b}$ passes through the third positive temperature coefficient material layer 42b from the third power input portion 410b of the third top electrode layer 41b and flows to the third bottom electrode layer 43b; and
3. Finally, the current $I_{3b}$ flows from the third power output portion 430b of the third bottom electrode layer 43b to another lateral conductive layer 80b in order to obtain a second OCP (Over-Current Protection) function due to the material property of the third positive temperature coefficient material layer 42b.

However, above-mentioned flow directions of the currents ($I_{1b}$, $I_{2b}$, $I_{3b}$) do not use to limit the present invention. For example, the currents ($I_{1b}$, $I_{2b}$, $I_{3b}$) can get new flow directions that are opposite to above-mentioned flow directions, and the function is the same. Moreover, the multi-layer type over-current and over-temperature protection structure of the present invention can be inverted, so that the bottom cover conductive pads 60b of the bottom cover insulating layer 6b can be as power input sides.

Furthermore, the number of the over-current and over-temperature protection elements and the insulative elements in the first and second embodiments does not use to limit the present invention. Two or more than two over-current and over-temperature protection elements and one or more insulative elements are protected in the present invention.

Figure 3:
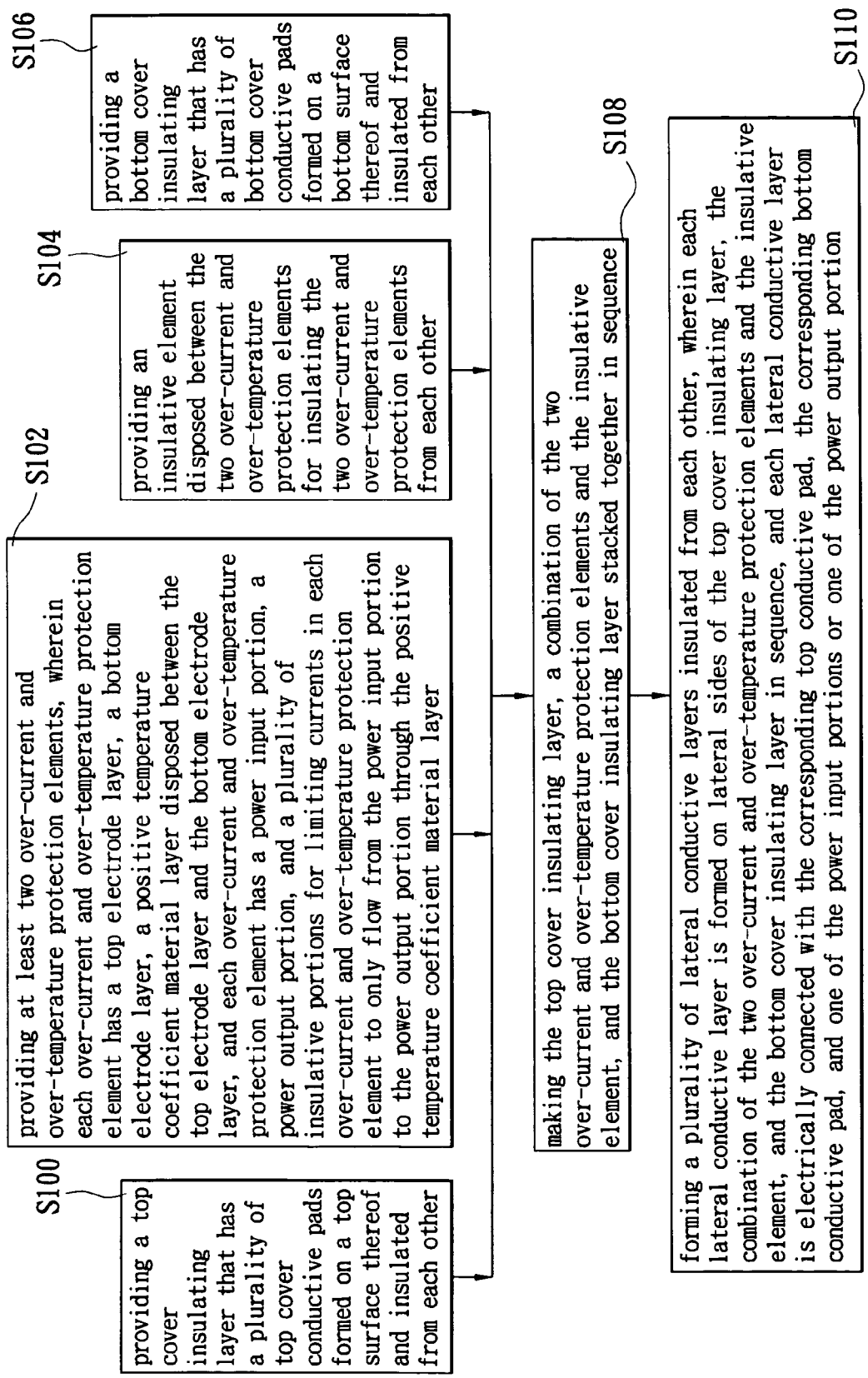
FIG. 3 is a flowchart of a method for manufacturing a multi-layer type over-current and over-temperature protection structure according to the first embodiment of the present invention.

FIG. 3 shows a flowchart of a method for manufacturing a multi-layer type over-current and over-temperature protection structure according to the first embodiment of the present invention. Referring to FIGS. 3 and 1A, the first embodiment of the present invention provides a method for manufacturing a multi-layer type over-current and over-temperature protection structure, including:

Step S100: providing a top cover insulating layer 1a that has a plurality of top cover conductive pads 10a formed on a top surface thereof and insulated from each other;

Step S102: providing at least two over-current and over-temperature protection elements (2a, 3a), wherein each over-current and over-temperature protection element (2a or 3a) has a top electrode layer (21a or 31a), a bottom electrode layer (23a or 33a), a positive temperature coefficient material layer (22a or 32a) disposed between the top electrode layer (21a or 31a) and the bottom electrode layer (23a or 33a), and each over-current and over-temperature protection element (2a or 3a) has a power input portion (210a or 310a), a power output portion (230a or 330a), and a plurality of insulative portions (211a, 231a or 311a, 331a) for limiting currents ($I_{1a}$, $I_{2a}$) in each over-current and over-temperature protection element (2a or 3a) to only flow from the power input portion (210a or 310a) to the power output portion (230a or 330a) through the positive temperature coefficient material layer (22a or 32a);

Step S104: providing an insulative element 5a disposed between the two over-current and over-temperature protection elements (2a, 3a) for insulating the two over-current and over-temperature protection elements (2a, 3a) from each other;

Step S106: providing a bottom cover insulating layer 6a that has a plurality of bottom cover conductive pads 60a formed on a bottom surface thereof and insulated from each other;

Step S108: making the top cover insulating layer 1a, a combination of the two over-current and over-temperature protection elements (2a, 3a) and the insulative element 5a, and the bottom cover insulating layer 6a stacked together in sequence; and Step S110: forming a plurality of lateral conductive layers 80a insulated from each other, wherein each lateral conductive layer 80a is formed on lateral sides of the top cover insulating layer 1a, the combination of the two over-current and over-temperature protection elements (2a, 3a) and the insulative element 5a, and the bottom cover insulating layer 6a in sequence, and each lateral conductive layer 80a is electrically connected with the corresponding top conductive pad 10a, the corresponding bottom conductive pad 60a, and one of the power input portions (210a, 310a) or one of the power output portion (230a, 330a).

Moreover, before the step S110, the method further includes: forming a plurality of lateral through grooves 70a insulated from each other via drilling or punching, wherein each lateral through groove 70a is formed from top to bottom on lateral sides of the top cover insulating layer 1a, the combination of the two over-current and over-temperature protection elements (2a, 3a) and the insulative element 5a, and the bottom cover insulating layer 6a in sequence, and the lateral conductive layers 80a are respectively formed on an inner surface of the lateral through grooves 70a.

Figure 4:
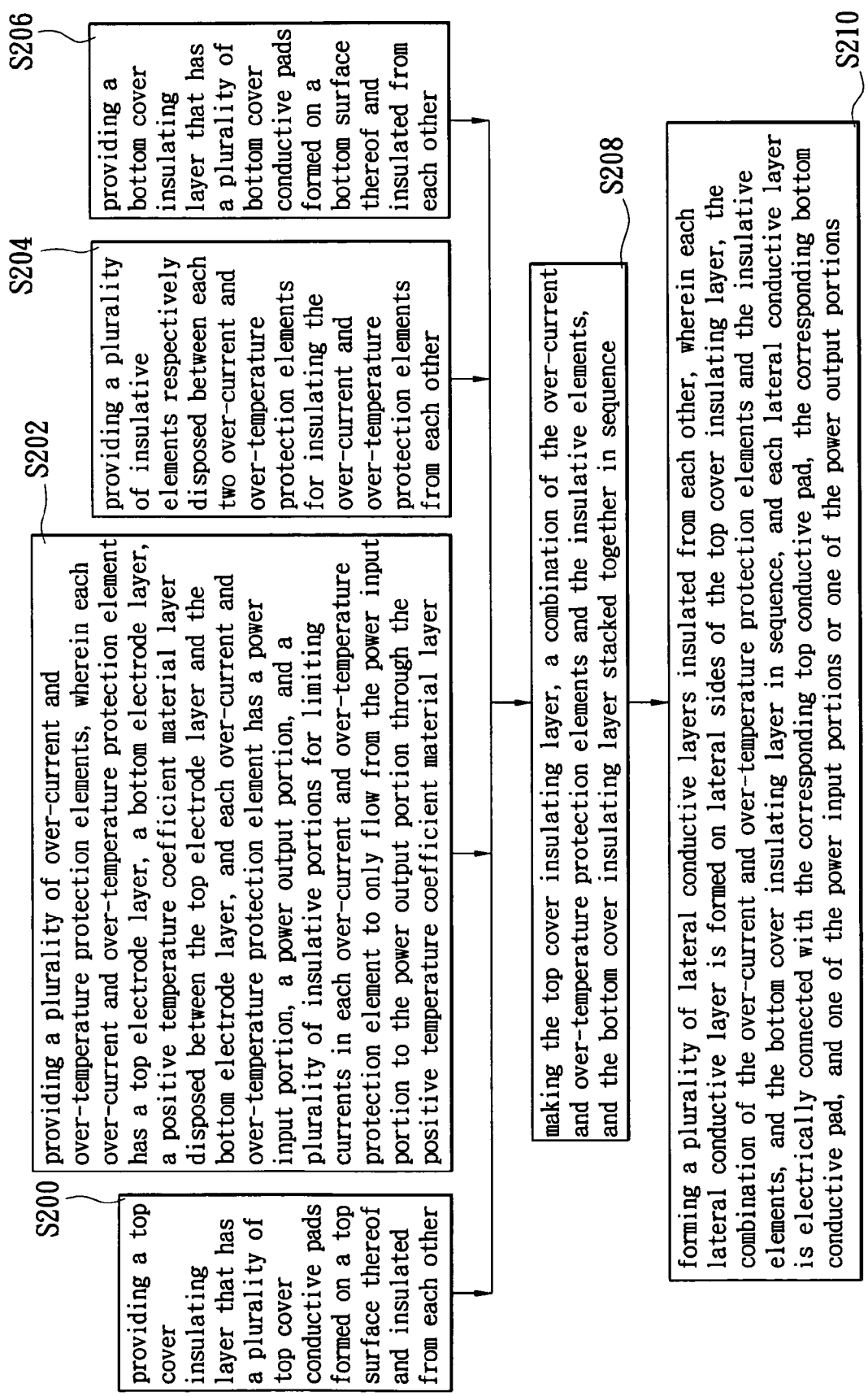
FIG. 4 is a flowchart of a method for manufacturing a multi-layer type over-current and over-temperature protection structure according to the second embodiment of the present invention.

FIG. 4 shows a flowchart of a method for manufacturing a multi-layer type over-current and over-temperature protection structure according to the second embodiment of the present invention. Referring to FIGS. 4 and 2A, the second embodiment of the present invention provides a method for manufacturing a multi-layer type over-current and over-temperature protection structure, including:

Step S200: providing a top cover insulating layer 1b that has a plurality of top cover conductive pads 10b formed on a top surface thereof and insulated from each other;

Step S202: providing a plurality of over-current and over-temperature protection elements (2b, 3b, 4b), wherein each over-current and over-temperature protection element (2b, 3b or 4b) has a top electrode layer (21b, 31b or 41b), a bottom electrode layer (23b, 33b or 43b), a positive temperature coefficient material layer (22b, 32b or 42b) disposed between the top electrode layer (21b, 31b or 41b) and the bottom electrode layer (23b, 33b or 43b), and each over-current and over-temperature protection element (2b, 3b or 4b) has a power input portion (210b, 310b or 410b), a power output portion (230b, 330b or 430b), and a plurality of insulative portions (211b, 231b or 311b, 331b or 411b, 431b) for limiting currents ($I_{1b}$, $I_{2b}$, $I_{3b}$) in each over-current and over-temperature protection element (2b, 3b or 4b) to only flow from the power input portion (210b, 310b or 410b) to the power output portion (230b, 330b or 430b) through the positive temperature coefficient material layer (22b, 32b or 42b);

Step S204: providing a plurality of insulative elements 5b respectively disposed between each two over-current and over-temperature protection elements (2b, 3b, 4b) for insulating the over-current and over-temperature protection elements (2b, 3b, 4b) from each other;

Step S206: providing a bottom cover insulating layer 6b that has a plurality of bottom cover conductive pads 60b formed on a bottom surface thereof and insulated from each other;

Step S208: making the top cover insulating layer 1b, a combination of the over-current and over-temperature protection elements (2b, 3b, 4b) and the insulative elements 5b, and the bottom cover insulating layer 6b stacked together in sequence; and Step S210: forming a plurality of lateral conductive layers 80b insulated from each other, wherein each lateral conductive layer 80b is formed on lateral sides of the top cover insulating layer 1b, the combination of the over-current and over-temperature protection elements (2b, 3b, 4b) and the insulative elements 5b, and the bottom cover insulating layer 6b in sequence, and each lateral conductive layer 80b is electrically connected with the corresponding top conductive pad 10b, the corresponding bottom conductive pad 60b, and one of the power input portions (210b, 310b, 410b) or one of the power output portions (230b, 330b, 430b).

Moreover, before the step S210, the method further includes: forming a plurality of lateral through grooves 70b insulated from each other via drilling or punching, wherein each lateral through groove 70b is formed from top to bottom on lateral sides of the top cover insulating layer 1b, the combination of the over-current and over-temperature protection elements (2b, 3b, 4b) and the insulative elements 5b, and the bottom cover insulating layer 6b in sequence, and the lateral conductive layers 80b are respectively formed on an inner surface of the lateral through grooves 70b.

Figure 5:
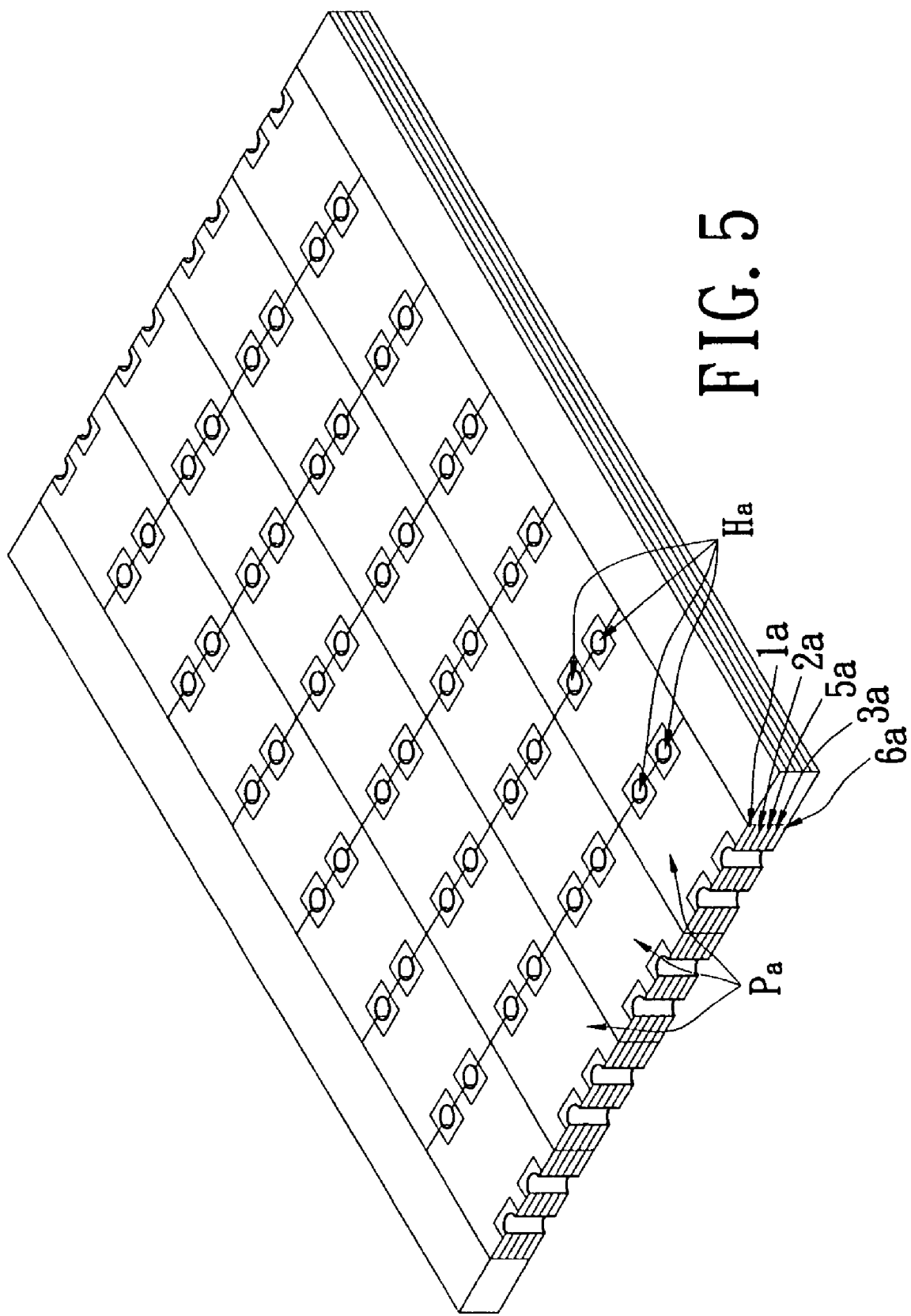
FIG. 5 is a perspective view of a stacked structure with five layers according to the first embodiment of the present invention (before many multi-layer type over-current and over-temperature protection structure are cut from the stacked structure)

FIG. 5 shows a perspective view of a stacked structure with five layers according to the first embodiment of the present invention (before many multi-layer type over-current and over-temperature protection structure are cut from the stacked structure). Firstly, each top cover insulating layer 1a, each first over-current and over-temperature protection elements 2a, each insulative element 5a, each second over-current and over-temperature protection elements 3a, and each bottom cover insulating layer 6a are drilled or punched in sequence to form a plurality of through holes $H_a$, and then many conductive layers are respectively coated on inner surfaces of the through holes $H_a$. Finally, each multi-layer type over-current and over-temperature protection structure $P_a$ (as shown in FIG. 1B) is cut from the stacked structure. Hence, the present invention can manufacture many multi-layer type over-current and over-temperature protection structure $P_a$ at the same time.

Figure 6:
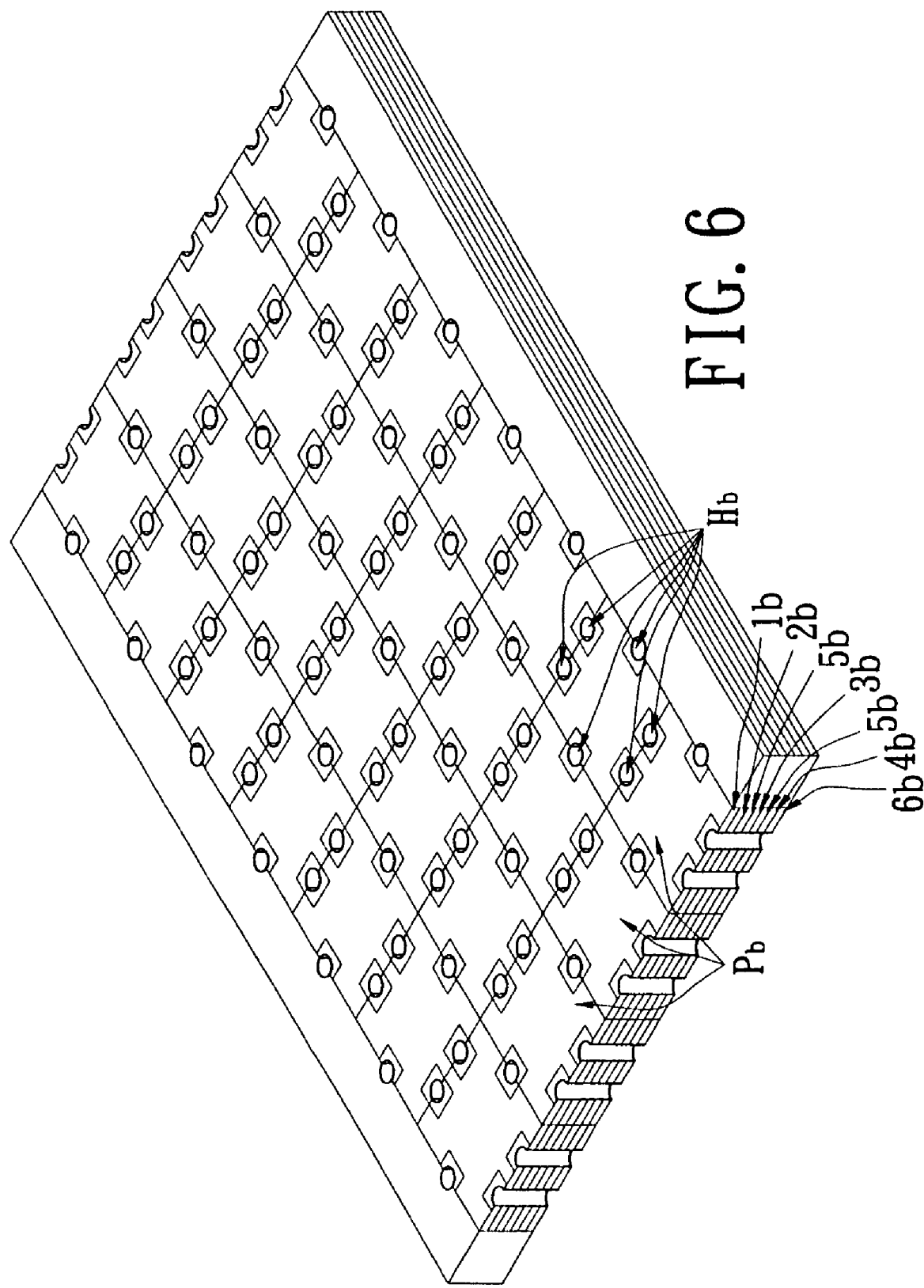
FIG. 6 is a perspective view of a stacked structure with seven layers according to the second embodiment of the present invention (before many multi-layer type over-current and over-temperature protection structure are cut from the stacked structure).

FIG. 6 shows a perspective view of a stacked structure with seven layers according to the second embodiment of the present invention (before many multi-layer type over-current and over-temperature protection structure are cut from the stacked structure). Firstly, each top cover insulating layer 1b, each first over-current and over-temperature protection elements 2b, each insulative element 5b, each second over-current and over-temperature protection elements 3b, each insulative element 5b, each third over-current and over-temperature protection elements 4b, and each bottom cover insulating layer 6b are drilled or punched in sequence to form a plurality of through holes $H_b$, and then many conductive layers are respectively coated on inner surfaces of the through holes $H_b$. Finally, each multi-layer type over-current and over-temperature protection structure $P_b$ (as shown in FIG. 2B) is cut from the stacked structure. Hence, the present invention can manufacture many multi-layer type over-current and over-temperature protection structure $P_b$ at the same time.

In conclusion, the present invention utilizes the concept of multi-layer design to integrated more than two passive components on a component structure that is adhered onto a substrate. Hence, the multi-layer type over-current and over-temperature protection structure has more than two over-current and over-temperature protection functions at the same time.

Therefore, the advantage of the present invention is that the multi-layer type over-current and over-temperature protection structure has more than two over-current and over-temperature protection functions at the same time. Hence, the present invention effectively integrates two or more passive components in order to increase the usage range of the over-current and over-temperature protection structure. Moreover, the present invention effectively reduces the size of the passive components on a PCB and reduces the number of solder joints.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multi-layer type over-current and over-temperature protection structure, comprising:

at least two over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer;

an insulative element disposed between the two over-current and over-temperature protection elements for insulating the two over-current and over-temperature protection elements from each other; and a lateral conductive unit having a plurality of lateral conductive layers insulated from each other, wherein each lateral conductive layer is formed from top to bottom on lateral sides of one of the two over-current and over-temperature protection elements, the insulative element, and the other over-current and over-temperature protection element in sequence, and each lateral conductive layer is electrically connected with one of the power input portions or one of the power output portions.

2. The multi-layer type over-current and over-temperature protection structure as claimed in claim 1, further comprising: a top cover insulating layer and a bottom cover insulating layer respectively disposed on the two over-current and over-temperature protection elements, and each lateral conducive layer formed on lateral sides of the top cover insulating layer and the bottom cover insulating layer, wherein the top cover insulating layer has a plurality of top cover conductive pads formed on a top surface thereof and respectively electrically connected with the lateral conductive layers, and the bottom cover insulating layer has a plurality of bottom cover conductive pads formed on a bottom surface thereof and respectively electrically connected with the lateral conductive layers.

3. The multi-layer type over-current and over-temperature protection structure as claimed in claim 2, wherein both the top cover insulating layer and the bottom cover insulating layer are made of polypropylene or fiberglass material.

4. The multi-layer type over-current and over-temperature protection structure as claimed in claim 2, wherein the top cover conductive pads and the bottom cover conductive pads are tinsels.

5. The multi-layer type over-current and over-temperature protection structure as claimed in claim 2, further comprising a lateral through groove unit that has a plurality of lateral through grooves insulated from each other, wherein each lateral through groove is formed from top to bottom on lateral sides of the top cover insulating layer, one of the two over-current and over-temperature protection elements, the insulative element, the other over-current and over-temperature protection element, and the bottom cover insulating layer in sequence, and the lateral conductive layers are respectively formed on inner surfaces of the lateral through grooves.

6. The multi-layer type over-current and over-temperature protection structure as claimed in claim 5, wherein each lateral through groove is composed of five half holes that are stacked to each other, and the half holes are respectively formed on the same sides of the top cover insulating layer, the two over-current and over-temperature protection elements, the insulative element and the bottom cover insulating layer.

7. The multi-layer type over-current and over-temperature protection structure as claimed in claim 1, wherein the top electrode layers and the bottom electrode layers are tinsels.

8. The multi-layer type over-current and over-temperature protection structure as claimed in claim 1, wherein the positive temperature coefficient material layer is a PPTC (Polymer Positive Temperature Coefficient) material layer, a resistance material layer, a capacitance material layer, or an inductance material layer.

9. The multi-layer type over-current and over-temperature protection structure as claimed in claim 1, wherein the insulative portions are respectively formed on a top surface of each top electrode layer and a bottom surface of each bottom electrode layer in order to insulate each top electrode layer and each bottom electrode layer from the lateral conductive layers via the insulative portions.

10. A multi-layer type over-current and over-temperature protection structure, comprising:
a plurality of over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer;
a plurality of insulative elements respectively disposed between each two over-current and over-temperature protection elements for insulating the over-current and over-temperature protection elements from each other; and
a lateral conductive unit having a plurality of lateral conductive layers insulated from each other, wherein each lateral conductive layer is formed from top to bottom on lateral sides of the two over-current and over-temperature protection elements and the insulative elements, and each lateral conductive layer is electrically connected with one of the power input portions or one of the power output portions.

11. The multi-layer type over-current and over-temperature protection structure as claimed in claim 10, further comprising: a top cover insulating layer and a bottom cover insulating layer respectively disposed on the upper over-current and over-temperature protection element and the lower over-current and over-temperature protection element, and each lateral conducive layer formed on lateral sides of the top cover insulating layer and the bottom cover insulating layer, wherein the top cover insulating layer has a plurality of top cover conductive pads formed on a top surface thereof and respectively electrically connected with the lateral conductive layers, and the bottom cover insulating layer has a plurality of bottom cover conductive pads formed on a bottom surface thereof and respectively electrically connected with the lateral conductive layers.

12. The multi-layer type over-current and over-temperature protection structure as claimed in claim 11, wherein both the top cover insulating layer and the bottom cover insulating layer are made of polypropylene or fiberglass material.

13. The multi-layer type over-current and over-temperature protection structure as claimed in claim 11, wherein the top cover conductive pads and the bottom cover conductive pads are tinsels.

14. The multi-layer type over-current and over-temperature protection structure as claimed in claim 11, further comprising a lateral through groove unit that has a plurality of lateral through grooves insulated from each other, wherein each lateral through groove is formed on lateral sides of the top cover insulating layer, the over-current and over-temperature protection elements, the insulative elements, and the bottom cover insulating layer, and the lateral conductive layers are respectively formed on inner surfaces of the lateral through grooves.

15. The multi-layer type over-current and over-temperature protection structure as claimed in claim 14, wherein each lateral through groove is composed of a plurality of half holes that are stacked to each other, and the half holes are respectively formed on the same sides of the top cover insulating layer, the over-current and over-temperature protection elements, the insulative elements and the bottom cover insulating layer.

16. The multi-layer type over-current and over-temperature protection structure as claimed in claim 10, wherein the top electrode layers and the bottom electrode layers are tinsels.

17. The multi-layer type over-current and over-temperature protection structure as claimed in claim 10, wherein the positive temperature coefficient material layer is a PPTC (Polymer Positive Temperature Coefficient) material layer, a resistance material layer, a capacitance material layer, or an inductance material layer.

18. The multi-layer type over-current and over-temperature protection structure as claimed in claim 10, wherein the insulative portions are respectively formed on a top surface of each top electrode layer and a bottom surface of each bottom electrode layer in order to insulate each top electrode layer and each bottom electrode layer from the lateral conductive layers via the insulative portions.

19. A method for manufacturing a multi-layer type over-current and over-temperature protection structure, comprising:
providing a top cover insulating layer that has a plurality of top cover conductive pads formed on a top surface thereof and insulated from each other;
providing at least two over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer;

providing an insulative element disposed between the two over-current and over-temperature protection elements for insulating the two over-current and over-temperature protection elements from each other;

providing a bottom cover insulating layer that has a plurality of bottom cover conductive pads formed on a bottom surface thereof and insulated from each other;

making the top cover insulating layer, a combination of the two over-current and over-temperature protection elements and the insulative element, and the bottom cover insulating layer stacked together in sequence; and forming a plurality of lateral conductive layers insulated from each other, wherein each lateral conductive layer is formed on lateral sides of the top cover insulating layer, the combination of the two over-current and over-temperature protection elements and the insulative element, and the bottom cover insulating layer in sequence, and each lateral conductive layer is electrically connected with the corresponding top conductive pad, the corresponding bottom conductive pad, and one of the power input portions or one of the power output portions.

20. The method as claimed in claim 19, wherein both the top cover insulating layer and the bottom cover insulating layer are made of polypropylene or fiberglass material.

21. The method as claimed in claim 19, wherein the top cover conductive pads and the bottom cover conductive pads are tinsels.

22. The method as claimed in claim 19, wherein before the step of forming the lateral conductive layers, the method further comprises: forming a plurality of lateral through grooves insulated from each other via drilling or punching, wherein each lateral through groove is formed from top to bottom on lateral sides of the top cover insulating layer, the combination of the two over-current and over-temperature protection elements and the insulative element, and the bottom cover insulating layer in sequence, and the lateral conductive layers are respectively formed on inner surfaces of the lateral through grooves.

23. The method as claimed in claim 22, wherein each lateral through groove is composed of five half holes that are stacked to each other, and the half holes are respectively formed on the same sides of the top cover insulating layer, the two over-current and over-temperature protection elements, the insulative element and the bottom cover insulating layer.

24. The method as claimed in claim 19, wherein the top electrode layers and the bottom electrode layers are tinsels.

25. The method as claimed in claim 19, wherein the positive temperature coefficient material layer is a PPTC (Polymer Positive Temperature Coefficient) material layer, a resistance material layer, a capacitance material layer, or an inductance material layer.

26. The method as claimed in claim 19, wherein the insulative portions are respectively formed on a top surface of each top electrode layer and a bottom surface of each bottom electrode layer in order to insulate each top electrode layer and each bottom electrode layer from the lateral conductive layers via the insulative portions.

27. A method for manufacturing a multi-layer type over-current and over-temperature protection structure, comprising:

providing a top cover insulating layer that has a plurality of top cover conductive pads formed on a top surface thereof and insulated from each other;

providing a plurality of over-current and over-temperature protection elements, wherein each over-current and over-temperature protection element has a top electrode layer, a bottom electrode layer, a positive temperature coefficient material layer disposed between the top electrode layer and the bottom electrode layer, and each over-current and over-temperature protection element has a power input portion, a power output portion, and a plurality of insulative portions for limiting currents in each over-current and over-temperature protection element to only flow from the power input portion to the power output portion through the positive temperature coefficient material layer;

providing a plurality of insulative elements respectively disposed between each two over-current and over-temperature protection elements for insulating the over-current and over-temperature protection elements from each other;

providing a bottom cover insulating layer that has a plurality of bottom cover conductive pads formed on a bottom surface thereof and insulated from each other;

making the top cover insulating layer, a combination of the over-current and over-temperature protection elements and the insulative elements, and the bottom cover insulating layer stacked together in sequence; and forming a plurality of lateral conductive layers insulated from each other, wherein each lateral conductive layer is formed on lateral sides of the top cover insulating layer, the combination of the over-current and over-temperature protection elements and the insulative elements, and the bottom cover insulating layer in sequence, and each lateral conductive layer is electrically connected with the corresponding top, conductive pad, the corresponding bottom conductive pad, and one of the power input portions or one of the power output portions.

28. The method as claimed in claim 27, wherein both the top cover insulating layer and the bottom cover insulating layer are made of polypropylene or fiberglass material.

29. The method as claimed in claim 27, wherein the top cover conductive pads and the bottom cover conductive pads are tinsels.

30. The method as claimed in claim 27, wherein before the step of forming the lateral conductive layers, the method further comprises: forming a plurality of lateral through grooves insulated from each other via drilling or punching, wherein each lateral through groove is formed from top to bottom on lateral sides of the top cover insulating layer, the combination of the over-current and over-temperature protection elements and the insulative elements, and the bottom cover insulating layer in sequence, and the lateral conductive layers are respectively formed on inner surfaces of the lateral through grooves.

31. The method as claimed in claim 30, wherein each lateral through groove is composed of seven half holes that are stacked to each other, and the half holes are respectively formed on the same sides of the top cover insulating layer, the combination of the over-current and over-temperature protection elements and the insulative elements, and the bottom cover insulating layer.

32. The method as claimed in claim 27, wherein the top electrode layers and the bottom electrode layers are tinsels.

33. The method as claimed in claim 27, wherein the positive temperature coefficient material layer is a PPTC (Polymer Positive Temperature Coefficient) material layer, a resistance material layer, a capacitance material layer, or an inductance material layer.

34. The method as claimed in claim 27, wherein the insulative portions are respectively formed on a top surface of each top electrode layer and a bottom surface of each bottom electrode layer in order to insulate each top electrode layer and each bottom electrode layer from the lateral conductive layers via the insulative portions.

* * * * *